US011710649B2

(12) United States Patent
Mizuta

(10) Patent No.: US 11,710,649 B2
(45) Date of Patent: Jul. 25, 2023

(54) BONDING APPARATUS, BONDING METHOD, AND METHOD FOR MANUFACTURING SEMICONDUCTOR DEVICE

(71) Applicant: Kioxia Corporation, Tokyo (JP)

(72) Inventor: Yoshio Mizuta, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 80 days.

(21) Appl. No.: 17/019,653

(22) Filed: Sep. 14, 2020

(65) Prior Publication Data

US 2021/0296147 A1    Sep. 23, 2021

(30) Foreign Application Priority Data

Mar. 19, 2020    (JP) .................................. 2020-049993

(51) Int. Cl.
*H01L 21/67* (2006.01)
*H01L 21/66* (2006.01)
*H01L 21/20* (2006.01)
*H01L 21/50* (2006.01)

(52) U.S. Cl.
CPC .... *H01L 21/67253* (2013.01); *H01L 21/2007* (2013.01); *H01L 21/50* (2013.01); *H01L 21/67288* (2013.01); *H01L 22/12* (2013.01)

(58) Field of Classification Search
CPC ........... H01L 21/67253; H01L 21/2007; H01L 21/50; H01L 21/67288; H01L 22/12; H01L 21/67092; H01L 21/68
See application file for complete search history.

(56) References Cited

U.S. PATENT DOCUMENTS 9,539,800 B2 * 1/2017 Kito .................... H01L 21/2007
10,586,727 B2   3/2020 Matsui et al.
2016/0225655 A1* 8/2016 Matsui ................ H01L 21/6875

FOREIGN PATENT DOCUMENTS

JP          2013-187393 A    9/2013
JP              5979135 B2    8/2016
JP              6348500 B2    6/2018
WO    WO-2009113312 A1 *    9/2009   ......... G06F 17/5068

* cited by examiner

*Primary Examiner* — Mohammed Shamsuzzaman
(74) *Attorney, Agent, or Firm* — Oblon, McClelland, Maier & Neustadt, L.L.P.

(57) ABSTRACT

An apparatus includes a first and second stages. The first and second stages respectively hold a first and second substrates. The second stage being opposed to the first stage. A stress application portion applies a stress to the first substrate based on a first magnification value. A calculator calculates the first magnification value based on a flatness of the first substrate and a first equation. The first equation represents a relation between flatness of a third substrate, a second magnification value, and an amount of pattern misalignment between the third substrate and a fourth substrate bonded to the third substrate. A controller controls the stress application portion to apply a stress to the first substrate on the first stage based on the first magnification value while the first and second substrates are bonded to each other.

6 Claims, 12 Drawing Sheets

| INPUT MAGNIFICATION VALUE | AMOUNT OF PATTERN MISALIGNMENT |
|---|---|
| X/Y=2.0/2.0 | X/Y=1.0/1.0 |
| X/Y=4.0/4.0 | X/Y=3.0/3.0 |
| X/Y=6.0/6.0 | X/Y=5.0/5.0 |
| X/Y=8.0/8.0 | X/Y=7.0/7.0 |
| (ppm) | (ppm) |

| INPUT MAGNIFICATION VALUE | AMOUNT OF PATTERN MISALIGNMENT |
|---|---|
| X/Y=2.0/2.0 | X/Y=2.0/2.0 |
| X/Y=4.0/4.0 | X/Y=4.0/4.0 |
| X/Y=6.0/6.0 | X/Y=6.0/6.0 |
| X/Y=8.0/8.0 | X/Y=8.0/8.0 |
| (ppm) | (ppm) |

| INPUT MAGNIFICATION VALUE | AMOUNT OF PATTERN MISALIGNMENT |
|---|---|
| X/Y=2.0/2.0 | X/Y=3.0/3.0 |
| X/Y=4.0/4.0 | X/Y=5.0/5.0 |
| X/Y=6.0/6.0 | X/Y=7.0/7.0 |
| X/Y=8.0/8.0 | X/Y=-9.0/9.0 |
| (ppm) | (ppm) |

| (a) OFFSET COMPONENT | | (f) FAN-SHAPED COMPONENT | |
|---|---|---|---|
| $\Delta dx = K1$ | $\Delta dy = K2$ | $\Delta dx = K11 \cdot y^2$ | $\Delta dy = K12 \cdot x^2$ |

| (b) MAGNIFICATION COMPONENT | | (g) C-SHAPED MAGNIFICATION COMPONENT | |
|---|---|---|---|
| $\Delta dx = K3 \cdot x$ | $\Delta dy = K4 \cdot y$ | $\Delta dx = K13 \cdot x^3$ | $\Delta dy = K14 \cdot y^3$ |

| (c) DIAMOND COMPONENT | | (h) ACCORDION COMPONENT | |
|---|---|---|---|
| $\Delta dx = K5 \cdot y$ | $\Delta dy = K6 \cdot x$ | $\Delta dx = K15 \cdot x^2 \cdot y$ | $\Delta dy = K16 \cdot x \cdot y^2$ |

| (d) ECCENTRIC MAGNIFICATION COMPONENT | | (i) C-SHAPED DISTORTION COMPONENT | |
|---|---|---|---|
| $\Delta dx = K7 \cdot x^2$ | $\Delta dy = K8 \cdot y^2$ | $\Delta dx = K17 \cdot x \cdot y^2$ | $\Delta dy = K18 \cdot x^2 \cdot y$ |

| (e) TRAPEZOIDAL COMPONENT | | (j) STREAMFLOW COMPONENT | |
|---|---|---|---|
| $\Delta dx = K9 \cdot x \cdot y$ | $\Delta dy = K10 \cdot x \cdot y$ | $\Delta dx = K19 \cdot y^3$ | $\Delta dy = K20 \cdot x^3$ |

FIG. 9

BONDING APPARATUS, BONDING METHOD, AND METHOD FOR MANUFACTURING SEMICONDUCTOR DEVICE

CROSS REFERENCE TO RELATED APPLICATIONS

This application is based upon and claims the benefit of priority from the prior Japanese Patent Application No. 2020-049993, filed on Mar. 19, 2020, the entire contents of which are incorporated herein by reference.

FIELD

The embodiments of the present invention relate to a bonding apparatus, bonding method and a method for manufacturing a semiconductor device.

BACKGROUND

There have been developed techniques of bonding a plurality of semiconductor substrates to each other to join wires to each other. A substrate bonding apparatus used for such bonding of semiconductor substrates needs to positionally align the semiconductor substrates with each other with high accuracy in order to join wires on the semiconductor substrates to each other.

However, there is a case where the magnification of a transfer pattern is changed because of warpage or distortion of a semiconductor substrate. This difference of magnification component between the semiconductor substrates is not eliminated even by correcting the positions of the semiconductor substrates. Therefore, because of the change of the shapes of semiconductor substrates, pattern misalignment between semiconductor substrates to be bonded to each other becomes a problem.

BRIEF DESCRIPTION OF THE DRAWINGS

FIGS. 3A to 5C are diagrams illustrating specific examples of a shape of the first substrate for learning, input magnification values, and the amounts of pattern misalignment;

FIG. 9 illustrates (a) an offset component, (b) a magnification component, (c) a diamond component, (d) an eccentric magnification component, (e) a trapezoidal component, (f) a fan-shaped component, (g) a C-shaped magnification component, (h) an accordion component, (i) a C-shaped distortion component, and (j) a streamflow component;

DETAILED DESCRIPTION

Figure 1:
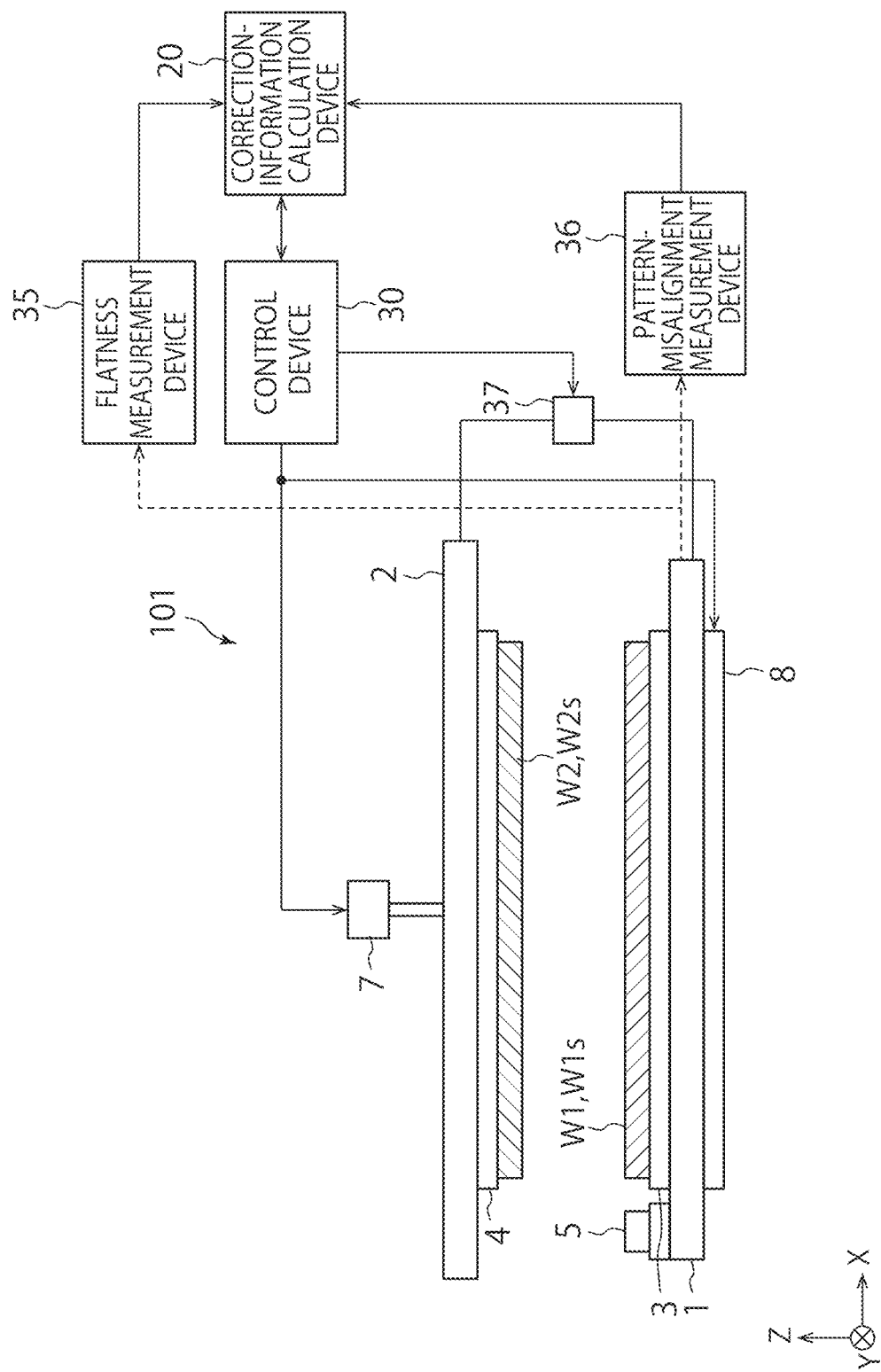
FIG. 1 is a diagram illustrating a configuration of a bonding apparatus according to the present embodiment.

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

A bonding apparatus according to the present embodiment includes a first and second stages. The first and second stages respectively hold a first and second substrates. The second stage being opposed to the first stage. A stress application portion applies a stress to the first substrate based on a first magnification value. A calculator calculates the first magnification value based on a flatness of the first substrate and a first equation. The first equation represents a relation between flatness of a third substrate, a second magnification value, and an amount of pattern misalignment between the third substrate and a fourth substrate bonded to the third substrate. A controller controls the stress application portion to apply a stress to the first substrate on the first stage based on the first magnification value while the first and second substrates are bonded to each other.

FIG. 1 is a diagram illustrating a configuration of a bonding apparatus according to the present embodiment. FIG. 1 illustrates a configuration of a bonding apparatus 101 as viewed from a Y-axis direction. In the present embodiment, a plane on which each of semiconductor substrates W1 and W2 is placed is an XY-plane, and surfaces of the semiconductor substrates W1 and W2 are orthogonal to a Z-axis.

The bonding apparatus 101 bonds the semiconductor substrates W1 and W2 to each other to electrically connect a wire and the like on one of the semiconductor substrates, that is, the first semiconductor substrate W1 to a wire and the like on the other semiconductor substrate, that is, the second semiconductor substrate W2. Each of the semiconductor substrates W1 and W2 may be, for example, a silicon wafer with a semiconductor element such as a transistor, or a wire formed on its surface. Although the semiconductor element (not illustrated) is covered and protected by an insulating film, a part of the wire is exposed on a top surface of the silicon wafer. The bonding apparatus 101 bonds the exposed wire on the semiconductor substrate W1 to the wire on the other semiconductor substrate W2, thereby electrically connecting these wires to each other.

The bonding apparatus 101 positionally aligns the first semiconductor substrate W1 absorbed onto a lower first stage 1 and the second semiconductor substrate W2 absorbed onto an upper second stage 2 with each other and bonds them to each other. Misalignment can be corrected by relative translation or rotation of the first or second stage 1 or 2 to some extent. However, in a case where the first or second semiconductor substrate W1 or W2 has distortion (warpage), the first and second semiconductor substrates W1 and W2 are different from each other in a magnification component, and therefore the most appropriate alignment cannot be achieved. This difference of magnification component cannot be corrected only by movement or rotation of the first or second stage 1 or 2. Therefore, the first or second stage 1 or 2 is deformed or expanded, thereby correcting the difference of magnification component between the first and second semiconductor substrates W1 and W2. For example, a pressure is applied to the first stage 1 from below to deform the first stage 1, so that distortion of a pattern on the first semiconductor substrate W1 is corrected. In a state where the distortion of the pattern has been corrected, the first and second semiconductor substrates W1 and W2 are bonded to each other.

However, distortion is different in each of the first and second semiconductor substrates W1 and W2 to be bonded to each other. Therefore, in a case where an input magnification value to the bonding apparatus 101 is fixed, the difference of magnification component may be not corrected. Meanwhile, obtaining an appropriate input magnification value in each bonding process is not realistic because it takes considerable time and effort.

Accordingly, the bonding apparatus 101 according to the present embodiment calculates a relational expression (equation) between flatness (the amount of warpage) of a semiconductor substrate and an input magnification value (hereinafter, "relational expression of flatness") in advance, by using sample substrates for learning. The input magnification value is an input value (a magnification-adjustment value) for applying a stress to the first semiconductor substrate W1. When performing a bonding process, the bonding apparatus 101 calculates an appropriate input magnification value corresponding to flatness (the amount of warpage) of the first semiconductor substrate W1 based on the flatness of the first semiconductor substrate W1 and the relational expression of flatness.

In a case where the input magnification value for applying a stress to the first semiconductor substrate W1 is not appropriate, misalignment between patterns on the first and second semiconductor substrates W1 and W2 actually bonded to each other (pattern misalignment) occurs. Therefore, in a case where the input magnification value is appropriate, patterns on the first and second semiconductor substrates W1 and W2 are aligned with each other (no pattern misalignment occurs).

In order to calculate the relational expression of flatness, first and second substrates for learning W1s and W2s are used as the sample substrates. For the sake of convenience, in FIG. 1, the first and second semiconductor substrates (substrates to be actually bonded to each other) are denoted by W1 and W2, respectively, and the first and second substrates for learning are denoted by W1s and W2s, respectively. The first and second substrates for learning W1s and W2s are formed of the same material as the first and second semiconductor substrates W1 and W2, and are silicon wafers, for example. The first substrates for learning W1s are different from each other in flatness (the amount of warpage). Meanwhile, the second substrates for learning W2s are substantially equal to each other in flatness, and are substantially flat (have the amount of warpage of approximately 0) preferably.

The bonding apparatus 101 creates a relational expression of flatness for each flatness of the first substrate for learning Wls by using a plurality of the first substrates for learning W1s. For example, the bonding apparatus 101 creates a relational expression of flatness corresponding to first flatness by using the first substrates for learning W1s that have the first flatness. At this time, while an input magnification value is changed with respect to the first substrates for learning W1s having the first flatness, the first and second substrates for learning W1s and W2s are actually bonded to each other and the amounts of pattern misalignment (overlay) are measured. It suffices to obtain the relational expression of flatness corresponding to the first flatness from the first flatness, the input magnification values, and the actual amounts of pattern misalignment.

Further, the bonding apparatus 101 creates a relational expression of flatness corresponding to the m-th (m is a natural number) flatness by using the first substrates for learning Wis that have the m-th flatness. At this time, while the input magnification value is changed with respect to the first substrates for learning Wis having the m-th flatness, the first and second substrates for learning W1s and W2s are actually bonded to each other and the amounts of pattern misalignment are measured. It suffices to obtain the relational expression of flatness corresponding to the m-th flatness from the m-th flatness, the input magnification values, and the actual amounts of pattern misalignment.

The first semiconductor substrates W1 as first bonding substrates that are used in actual bonding are semiconductor substrates having various kinds of flatness. When bonding the first and second semiconductor substrates W1 and W2 to each other, the bonding apparatus 101 measures flatness of the first semiconductor substrate W1 and calculates an input magnification value by using a relational expression of flatness corresponding to the closest flatness to the actually measured flatness. In the following descriptions, the input magnification value obtained from the relational expression of flatness by using the actual flatness of the first semiconductor substrate W1 is referred to as "corrected magnification value".

The bonding apparatus 101 includes the first stage 1, the second stage 2, suction chucks 3 and 4, a camera 5, a pushing pin 7, a stress device 8, a correction-information calculation device 20, a control device 30, a flatness measurement device 35, a pattern-misalignment measurement device 36, and a driving mechanism 37.

The first stage 1 holds the first semiconductor substrate W1 in such a manner that the first semiconductor substrate W1 can be moved in an XY-plane (a horizontal plane) substantially parallel to a surface of the first semiconductor substrate W1. The first stage 1 may be configured to move the first semiconductor substrate W1 in a Z-direction. When the first and second semiconductor substrates W1 and W2 are positionally aligned with each other, the first stage 1 can translate the first semiconductor substrate W1 in the XY-plane or can rotate the first semiconductor substrate W1. The first stage 1 can move the first semiconductor substrate W1 in the Z-direction when the first and second semiconductor substrates W1 and W2 are bonded to each other.

The suction chuck 3 is provided on the first stage 1. The suction chuck 3 fixes the back surface of the first semiconductor substrate W1 at a predetermined position on the first stage 1. The suction chuck 3 may be, for example, a vacuum chuck or an electrostatic chuck. Further, the camera 5 is provided on the first stage 1. The camera 5 detects relative positions of the first and second stages 1 and 2 and is used for positional alignment between the first and second semiconductor substrates W1 and W2. The position of the camera 5 is not specifically limited.

The stress device 8 is provided on the bottom of the first stage 1. The stress device 8 applies a stress to the first semiconductor substrate W1 by applying a barometric pressure or the like to the first stage 1, for example. The stress device 8 may apply a stress to the first stage 1 and the first semiconductor substrate W1 by using an actuator or the like. The stress device 8 adjusts the shape and the size of the first semiconductor substrate W1 by the amounts corresponding to an input magnification value from the correction-information calculation device 20. Accordingly, a pedestal surface (mesa) of the first stage 1 is deformed, and the shape and the size of the first semiconductor substrate W1 are also changed. That is, a magnification component of a pattern on the first semiconductor substrate W1 is adjusted. As a result, the pattern misalignment between the first and second semiconductor substrates W1 and W2 can be corrected.

The second stage 2 holds the second semiconductor substrate W2 in such a manner that the second semiconductor substrate W2 can be moved in an XY-plane (a horizontal plane) substantially parallel to a surface of the second semiconductor substrate W2. The second stage 2 may be configured to move the second semiconductor substrate W2 in the Z-direction. When the first and second semiconductor substrates W1 and W2 are positionally aligned with each other, the second stage 2 can translate the second semiconductor substrate W2 in the XY-plane or can rotate the second semiconductor substrate W2. The second stage 2 can move the second semiconductor substrate W2 in the Z-direction when the first and second semiconductor substrates W1 and W2 are bonded to each other. Both the first and second stages 1 and 2 may be moved in the XY-plane or in an X-direction, or either one of them may be moved.

The suction chuck 4 is provided on the second stage 2. The suction chuck 4 fixes the back surface of the second semiconductor substrate W2 at a predetermined position on the second stage 2. The suction chuck 4 may be, for example, a vacuum chuck or an electrostatic chuck.

The pushing pin 7 is provided at the center of the second stage 2. The pushing pin 7 penetrates through the second stage 2 from the back surface side of the second stage 2. When the second semiconductor substrate W2 is bonded to the first semiconductor substrate W1, the pushing pin 7 is driven from the back side of the second stage 2 toward the second semiconductor substrate W2 to push the second semiconductor substrate W2 from its back surface in such a manner that the second semiconductor substrate W2 is separated from the second stage 2. Accordingly, the second semiconductor substrate W2 is bonded to the first semiconductor substrate W1 radially from its center to the outer circumference.

The control device 30 is connected to each constituent element of the bonding apparatus 101 and controls each constituent element. For example, the control device 30 controls the stress device 8 in accordance with an input magnification value to apply a stress to the first stage 1. Further, the control device 30 controls the driving mechanism 37 that moves the first stage 1 and/or the second stage 2 to positionally align the first and second semiconductor substrates W1 and W2 with each other. Furthermore, the control device 30 controls the pushing pin 7 to push out the second semiconductor substrate W2, thereby bonding the first and second semiconductor substrates W1 and W2 to each other.

When the first and second substrates for learning W1s and W2s are bonded to each other and a relational expression of flatness is obtained, the control device 30 drives the stress device 8 in accordance with an input magnification value without correcting the input magnification value. Further, the control device 30 sends the input magnification value that has not been corrected to the flatness measurement device 35.

Meanwhile, when the first and second semiconductor substrates W1 and W2 are bonded to each other, the control device 30 drives the stress device 8 by using a corrected magnification value sent from the correction-information calculation device 20.

The flatness measurement device 35 measures flatness of the first semiconductor substrate W1 or the first substrate for learning W1s. The flatness measurement device 35 measures the flatness of the first semiconductor substrate W1 or the first substrate for learning W1s before the substrate is absorbed by the suction chuck 3. That is, the flatness measurement device 35 measures accurate flatness (the amount of warpage or distortion) of the first semiconductor substrate W1 or the first substrate for learning W1s in a state where any stress is not applied, and the substrate is released. The flatness measurement device 35 sends the measured flatness to the correction-information calculation device 20.

The pattern-misalignment measurement device 36 measures the amount of pattern misalignment (overlay) between the first and second substrates for learning W1s and W2s bonded to each other. The pattern-misalignment measurement device 36 sends the measured amount of pattern misalignment to the correction-information calculation device 20. The amount of pattern misalignment can be considered as the amount of difference of magnification component between the first and second substrates for learning W1s and W2s.

The correction-information calculation device 20 calculates a relational expression of flatness for each first substrate for learning W1s by using the flatness of the first substrate for learning W1s, the amount of pattern misalignment between the first and second substrates for learning W1s and W2s, and an input magnification value. The correction-information calculation device 20 also calculates a corrected magnification value by applying the flatness of the first semiconductor substrate W1 to the relational expression of flatness. The correction-information calculation device 20 sends the corrected magnification value thus calculated to the control device 30.

The correction-information calculation device 20 includes a user interface (an input portion 95 in FIG. 12) and allows input of an input magnification value thereto. Alternatively, the user interface of the correction-information calculation device 20 can be also used for switching a learning operation of calculating a relational expression of flatness and an actual bonding operation of performing bonding with a corrected magnification value obtained by using the relational expression of flatness.

Figure 2:
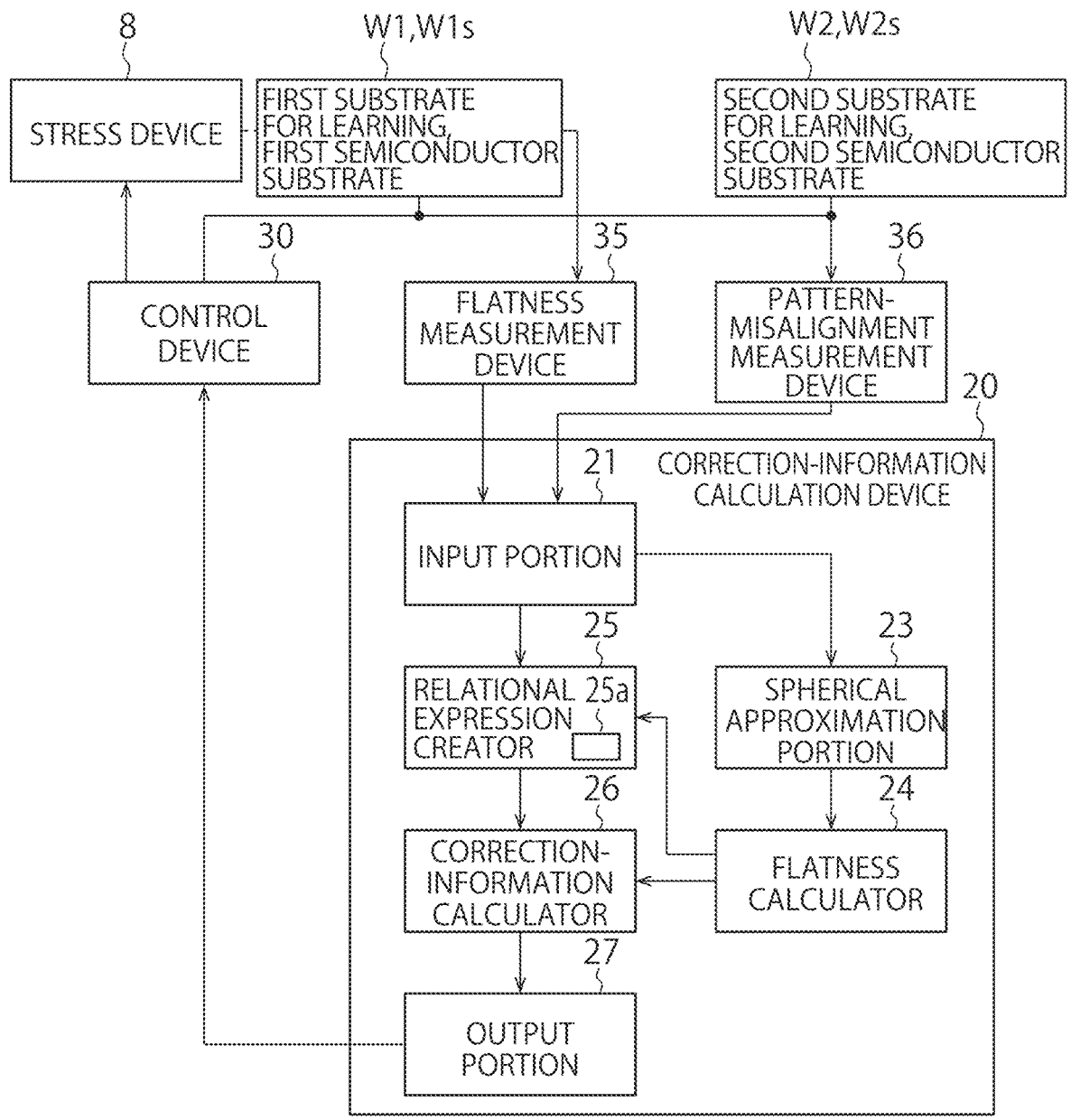
FIG. 2 is a diagram illustrating a configuration of a correction-information calculation device according to the first embodiment.

FIG. 2 is a diagram illustrating a configuration of a correction-information calculation device according to the first embodiment. The correction-information calculation device 20 includes an input portion 21, a spherical approximation portion 23, a flatness calculator 24, a relational expression creator 25, a correction-information calculator 26, and an output portion 27.

In the bonding apparatus 101, the stress device 8 applies a stress to the first stage 1. The control device 30 is connected to the stress device 8 and the pattern-misalignment measurement device 36. The control device 30 sends an input magnification value or a corrected magnification value to the stress device 8 and the pattern-misalignment measurement device 36.

The flatness measurement device 35 is provided for the first stage 1, and measures flatness (the amount of warpage) of the first semiconductor substrate W1 or the first substrate for learning W1s and sends the measurement result (a measured value of flatness) to the correction-information calculation device 20. The pattern-misalignment measurement device 36 is connected to the correction-information calculation device 20. The pattern-misalignment measurement device 36 measures the amount of pattern misalignment between the first and second semiconductor substrates W1 and W2 actually bonded to each other or the amount of pattern misalignment between the first and second substrates for learning W1s and W2s. The pattern-misalignment measurement device 36 sends correspondence information in which the amount of pattern misalignment that is the measurement result and the input magnification value from the control device 30 are associated with each other, to the correction-information calculation device 20.

The input portion 21 inputs the measured value of flatness sent from the flatness measurement device 35 thereto, and sends it to the spherical approximation portion 23. The input portion 21 also inputs the correspondence information sent from the pattern-misalignment measurement device 36 thereto, and sends it to the relational expression creator 25.

The spherical approximation portion 23 calculates coefficients in a case where the measured value of flatness is approximated by using a function with polar coordinates. Specifically, the spherical approximation portion 23 calculates the Zernike coefficients by approximating the measurement value of flatness with the Zernike series. The spherical approximation portion 23 sends the Zernike coefficients to the flatness calculator 24.

The flatness calculator 24 calculates flatness (the amount of warpage) of the first semiconductor substrate W1 or the first substrate for learning W1s based on the Zernike coefficients. The flatness (the amount of warpage) calculated here is referred to as "calculated value of flatness" for the sake of convenience.

The flatness calculator 24 sends the calculated value of flatness to the relational expression creator 25 in a case where it calculates the calculated value of flatness of the first substrate for learning W1s. The flatness calculator 24 sends the calculated value of flatness to the correction-information calculator 26 in a case where it calculates the calculated value of flatness of the first semiconductor substrate W1.

When receiving the calculated value of flatness of the first substrate for learning W1s, the relational expression creator 25 calculates a relational expression of flatness by using various calculated values of flatness and the various amounts of pattern misalignment. The relational expression creator 25 calculates a relational expression of flatness for each calculated value of flatness of the first substrate for learning W1s.

When receiving the calculated value of flatness of the first semiconductor substrate W1, the correction-information calculator 26 selects a relational expression of flatness calculated by using the first substrate for learning W1s that has the closest flatness to the calculated value of flatness of the first semiconductor substrate W1. The correction-information calculator 26 calculates a corrected magnification value by substituting the calculated value of flatness of the first semiconductor substrate W1 into the relational expression of flatness selected from the relational expression creator 25. The correction-information calculator 26 further sends the corrected magnification value thus calculated to the output portion 27. The output portion 27 sends the corrected magnification value to the control device 30.

The control device 30 controls the stress device 8 in accordance with a corrected magnification value. The control device 30 applies the corrected magnification value to the stress device 8 in preference to an input magnification value from the correction-information calculation device 20. Alternatively, the control device 30 corrects the input magnification value with the corrected magnification value. Accordingly, the stress device 8 can apply a stress to the first semiconductor substrate W1 with the appropriate corrected magnification value that corresponds to the flatness of the first semiconductor substrate W1. As a result, the bonding apparatus 101 can reduce the amount of pattern misalignment between the first and second semiconductor substrates W1 and W2 after being bonded to each other more.

In a learning operation, the bonding apparatus 101 performs bonding with various input magnification values with respect to the first substrates for learning W1s that have substantially the same calculated value of flatness, in response to an instruction from the control device 30. The various input magnification values may be automatically generated by the control device 30 or be input by an operator via the correction-information calculation device 20. For example, the bonding apparatus 101 performs bonding with the first to P-th (P is a natural number of 2 or more) input magnification values with respect to the first substrates for learning W1s that have the first calculated value of flatness. Further, the bonding apparatus 101 performs bonding with the first to P-th input magnification values with respect to the first substrates for learning W1s that have the second calculated value of flatness. P is the same as or smaller than the number of the first substrates for learning W1s that have the same flatness.

Figures 3A, 3B, 3C:
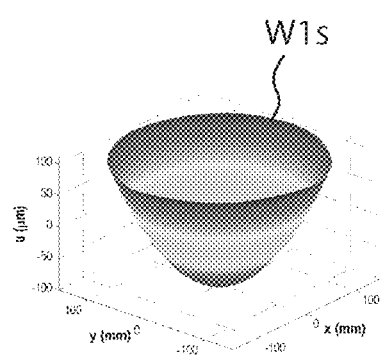

For example, FIGS. 3A to 5C are diagrams illustrating specific examples of a shape of the first substrate for learning, input magnification values, and the amounts of pattern misalignment. As illustrated in FIG. 3A, with respect to the first substrates for learning W1s that warp like a bowl and have substantially the same calculated value of flatness C1, bonding is performed with input magnification values (x, y)=(2.0 ppm, 2.0 ppm) to (8.0 ppm, 8.0 ppm) as illustrated in FIG. 3B. The input magnification value (x, y) indicates the extension amount (ppm (parts per million)) of a substrate in the x- and y-direction in an xy-plane in FIG. 3A. At this time, as illustrated in FIG. 3C, the amounts of pattern misalignment (x, y) measured by the pattern-misalignment measurement device 36 are (1.0 ppm, 1.0 ppm) to (7.0 ppm, 7.0 ppm).

Figures 4A, 4B, 4C:
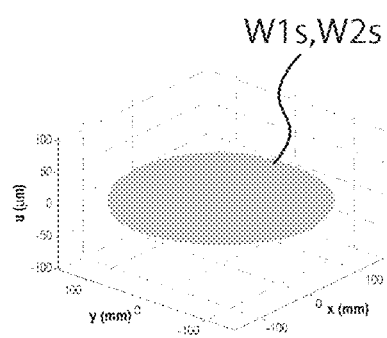

In FIG. 4A, with respect to the first substrates for learning W1s that are substantially flat and have substantially the same calculated value of flatness C2, bonding is performed with input magnification values (x, y)=(2.0 ppm, 2.0 ppm) to (8.0 ppm, 8.0 ppm) as illustrated in FIG. 4B. The amounts of pattern misalignment obtained as a result of the above bonding are described in FIG. 4C.

Figures 5A, 5B, 5C:
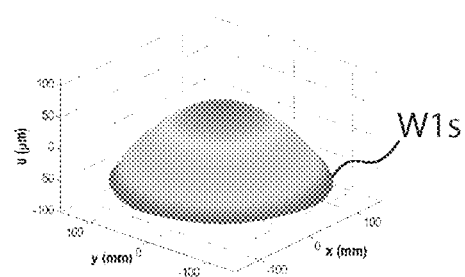

In FIG. 5A, with respect to the first substrates for learning W1s that are convex and have substantially the same calculated value of flatness C3, bonding is performed with input magnification values (x, y)=(2.0 ppm, 2.0 ppm) to (8.0 ppm, 8.0 ppm) as illustrated in FIG. 5B. The amounts of pattern misalignment obtained as a result of the above bonding are described in FIG. 5C.

The amount of pattern misalignment between the first and second substrates for learning W1s and W2s bonded to each other in a bonding process is measured by the pattern-misalignment measurement device 36. Correspondence information in which these calculated values of flatness C1 to C3, the amounts of pattern misalignment, and the input magnification values are associated with one another is sent to the relational expression creator 25 via the input portion 21. Correspondence information is information in which the calculated values of flatness C1 to C3 of the first substrates for learning W1s, the input magnification values, and the respective amounts of pattern misalignment are associated with one another.

The relational expression creator 25 calculates a relational expression of flatness based on the correspondence information. The relational expression creator 25 calculates a relational expression of flatness for each of the calculated values of flatness (corresponding to each of the calculated values of flatness C1 to C3) of the first substrates for learning W1s based on a correspondence between the measured amount of pattern misalignment and the input magnification value.

Figure 6:
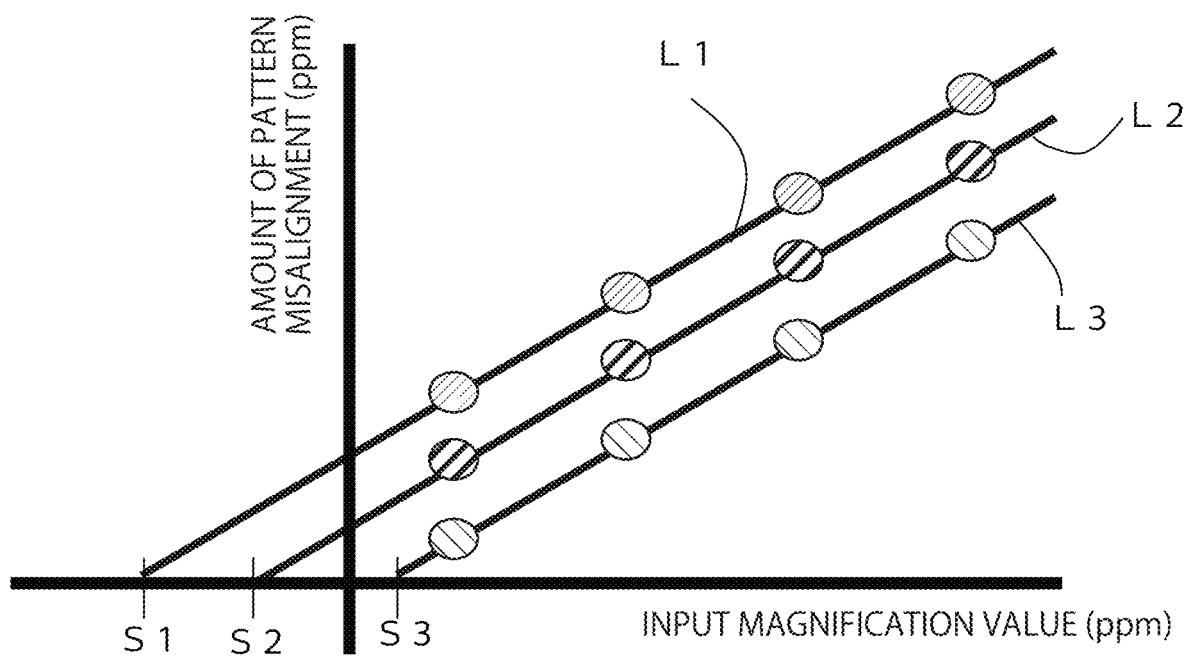
FIG. 6 includes graphs each representing a correspondence between the amount of pattern misalignment and an input magnification value.

FIG. 6 includes graphs each representing a correspondence between the amount of pattern misalignment and an input magnification value. A line L1 is a graph obtained by using the first substrate for learning W1s that has the calculated value of flatness C1 (a bowl-like shape) in FIG. 3A. A line L2 is a graph obtained by using the first substrate for learning W1s that has the calculated value of flatness C2 (i.e., that is substantially flat) in FIG. 4A. A line L3 is a graph obtained by using the first substrate for learning W1s that has the calculated value of flatness C3 (a convex shape) in FIG. 5A. The graphs in FIG. 6 is merely schematic, and are not always coincident with values in FIGS. 3A to 5C.

As described above, a correspondence between an input magnification value and the amount of pattern misalignment is obtained for each calculation value of flatness. Assuming that the amount of pattern misalignment (the difference amount of magnification component) is OL, an input magnification value is S, a calculated value of flatness (the amount of warpage) is C, and a coefficient is k, the amount of pattern misalignment OL is represented by a relational expression of flatness in an expression (equation) 1.

$$OL = S + k \times C \quad \text{(expression 1)}$$

The relational expression of flatness represents a relation among flatness of the first substrate for learning W1s, an input magnification value, and the amount of pattern misalignment between the first and second substrates for learning W1s and W2s bonded to each other. Although the expression 1 is represented by a linear function in the present embodiment for the sake of convenience, the expression 1 may be a quadratic or higher-order function.

When the input magnification values S and the amounts of pattern misalignment OL for the calculated values of flatness C1 to C3 are input into the expression 1, coefficients k1 to k3 can be calculated. The coefficients k1 to k3 are coefficients in the expression 1 for the calculated values of flatness C1 to C3, respectively. The relational expression creator 25 stores therein the coefficients k1 to k3 respectively corresponding to the lines L1 to L3. Alternatively, the relational expression creator 25 may store therein the expression 1 into which the calculated coefficients k1 to k3 are substituted, respectively. Further, the relational expression creator 25 may obtain relational expressions between the input magnification values S1 to S3 and the calculated values of flatness C1 to C3, each of which makes the amount of pattern alignment OL zero, from the expression 1 and store these relational expressions therein. The following descriptions are made assuming that the relational expression creator 25 stores therein the relational expression of flatness represented by the expression 1. The relational expression creator 25 includes a memory 25a. It suffices to store correspondence information, the relational expressions of flatness, the coefficients k1 to k3, relational expressions between the input magnification values S1 to S3 and the calculated values of flatness C1 to C3, or the like in the memory 25a.

In the above example, the relational expression creator 25 calculates the coefficients k1 to k3 for the three calculated values of flatness C1 to C3, respectively. However, the relational expression creator 25 may calculate the coefficients k by using the first substrates for learning W1s that have four or more kinds of flatness (the amounts of warpage). The relational expressions of flatness are used when the first and second semiconductor substrates W1 and W2 are actually bonded to each other.

In the present embodiment, the relational expressions of flatness are created in advance by using the first and second substrates for learning W1s and W2s in this manner. Accordingly, the relational expression of flatness that corresponds to each flatness of the first substrate for learning W1s is calculated. Further, when the first and second semiconductor substrates W1 and W2 are bonded to each other in an actual bonding process, a corrected magnification value is calculated from the relational expression of flatness corresponding to flatness of the first semiconductor substrate W1. The stress device 8 then applies a stress to the first semiconductor substrate W1 based on the corrected magnification value.

Figure 7:
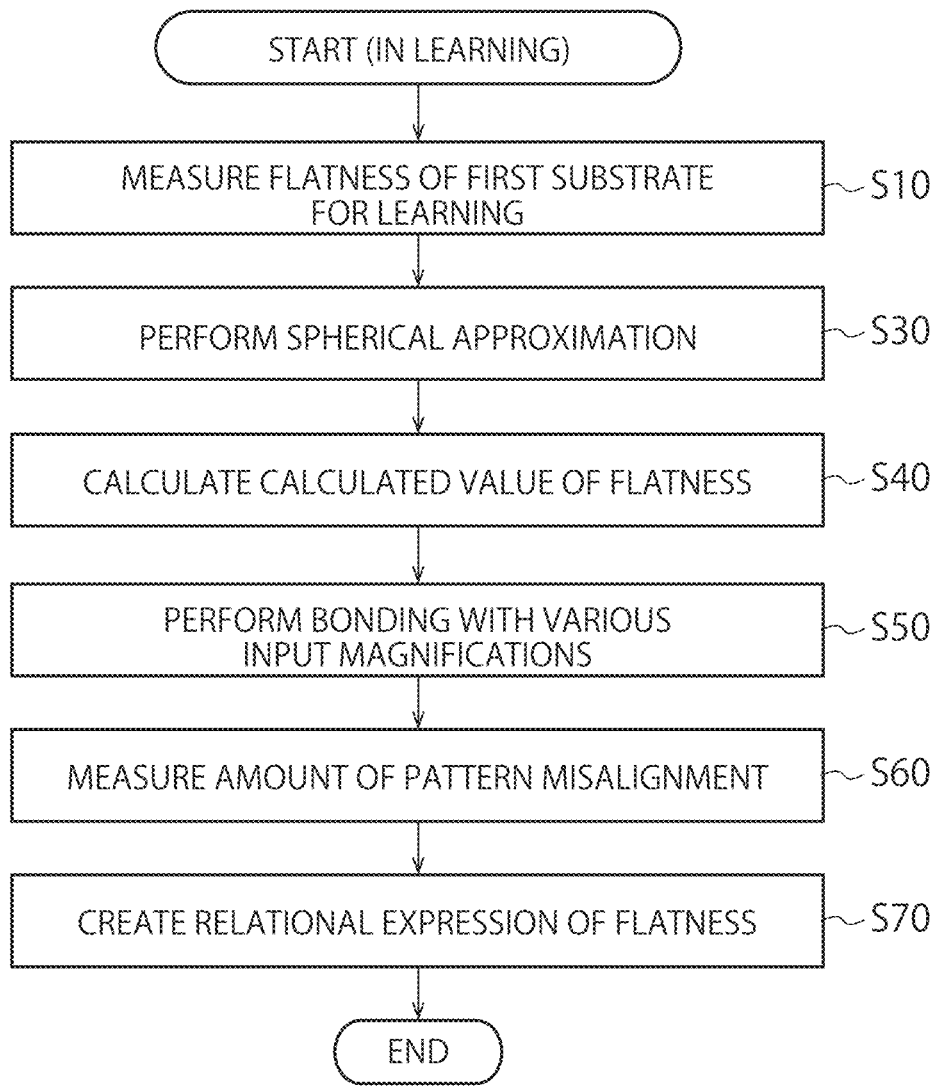
FIG. 7 is a flowchart illustrating a procedure of calculating a corrected magnification value.

FIG. 7 is a flowchart illustrating a procedure of calculating a corrected magnification value.

First, the flatness measurement device 35 performs measurement of substrate flatness (the amount of warpage of substrate) for a plurality of the first substrates for learning W1s (Step S10). At this time, the flatness measurement device 35 measures the substrate flatness in a state where each first substrate for learning W1s is released before the first stage 1 absorbs the first substrate for learning W1s. The flatness measurement device 35 sends the measured substrate flatness to the correction-information calculation device 20.

The spherical approximation portion 23 calculates the Zernike coefficients by performing approximation using the substrate flatness with the Zernike series. Accordingly, the spherical approximation portion 23 performs spherical approximation for the substrate flatness with respect to each first substrate for learning W1s (Step S30).

The flatness calculator 24 calculates a calculated value of flatness that affects an element-forming surface of each first substrate for learning W1s based on the Zernike coefficients (Step S40).

The bonding apparatus 101 performs a process of bonding the first and second substrates for learning W1s and W2s to each other with various input magnification values for each flatness of the first substrate for learning W1s (Step S50). Accordingly, the first and second substrates for learning W1s and W2s are bonded to each other for each flatness and each input magnification value. On the second stage 2 side to which input of a magnification is not performed, it is desirable to use the second substrate for learning W2s that is equivalent to the first substrate for learning W1s in the shape.

The pattern-misalignment measurement device 36 measures the amount of pattern misalignment (overlay) between the first and second substrates for learning W1s and W2s after being bonded to each other (Step S60). The pattern-misalignment measurement device 36 generates correspondence information in which the calculated value of flatness of the first substrate for learning W1s, the amount of pattern misalignment, and the input magnification value from the control device 30 are associated with one another. The pattern-misalignment measurement device 36 generates the correspondence information for each flatness of the first substrate for learning W1s.

Each correspondence information is sent to the relational expression creator 25 via the input portion 21. The relational expression creator 25 substitutes the correspondence information into a relational expression of flatness (the expression 1) to calculate the coefficients k1 to k3. The coefficients k1 to k3 are stored in the memory 25a. Alternatively, the relational expressions of flatness into which the coefficients k1 to k3 are input, respectively, are stored in the memory 25a. Alternatively, relational expressions between the input magnification values S1 to S3 and the calculated values of flatness C1 to C3 when it is assumed that OL is zero (for example, S1=−C1/k1, S2=−C2/k2, and S3=−C3/k3) are stored in the memory 25a.

Figure 8:
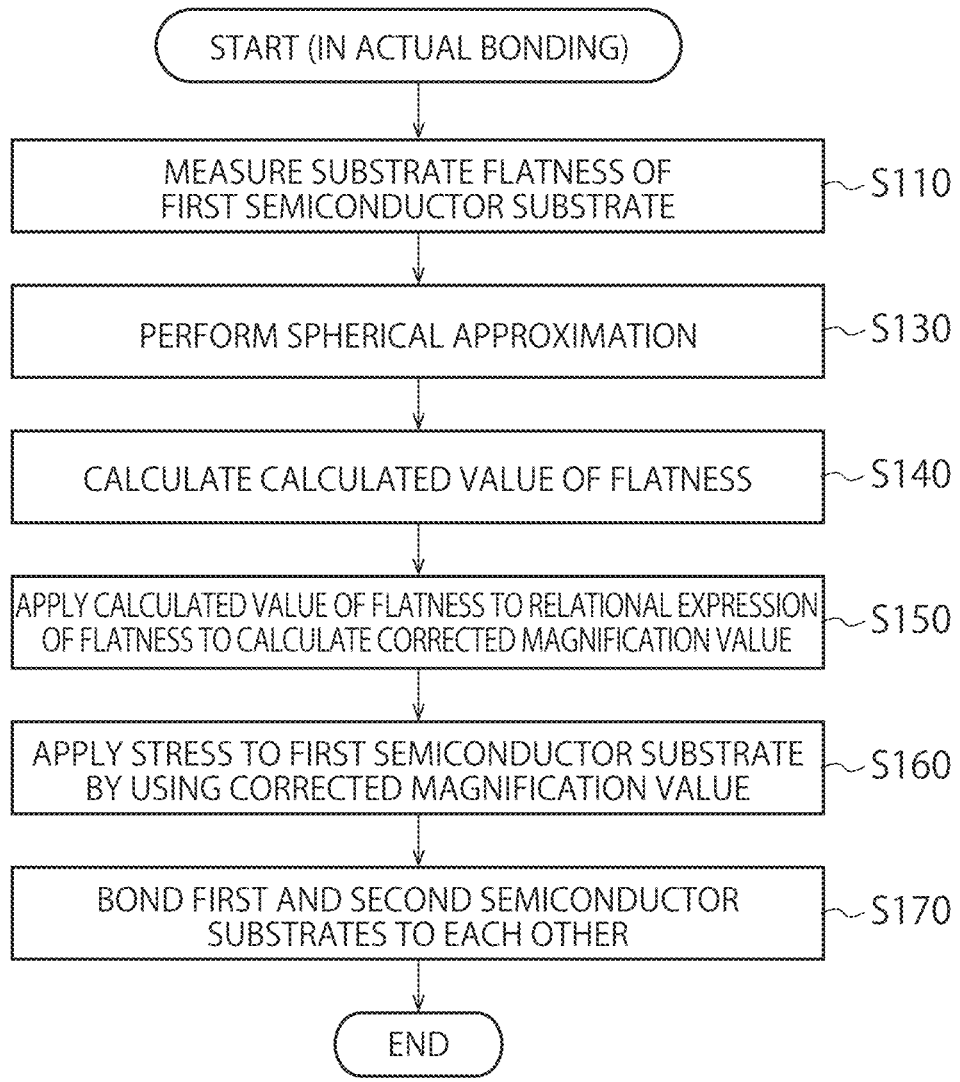
FIG. 8 is a flowchart illustrating a procedure of an actual bonding process.

FIG. 8 is a flowchart illustrating a procedure of an actual bonding process. When the first and second semiconductor substrates W1 and W2 for product are bonded to each other, the first and second semiconductor substrates W1 and W2 are first carried into the bonding apparatus 101.

The flatness measurement device 35 measures substrate flatness of the first semiconductor substrate W1 (Step S110). The flatness measurement device 35 measures the substrate flatness before the first stage 1 absorbs the first semiconductor substrate W1. The flatness measurement device 35 sends the measured substrate flatness to the correction-information calculation device 20.

The correction-information calculation device 20 performs approximation with Zernike series by using back-surface flatness of the first semiconductor substrate W1, thereby performing spherical approximation for the substrate flatness, as in Step S30 (Step S130).

The flatness calculator 24 calculates a calculated value of flatness that affects an element-forming surface (a bonding surface) of the first semiconductor substrate W1 (Step S140).

The correction-information calculator 26 calculates a corrected magnification value for the first semiconductor substrate W1 based on the calculated value of flatness of the first semiconductor substrate W1 and a relational expression of flatness stored in the memory 25a of the relational expression creator 25. Specifically, the correction-information calculator 26 calculates the corrected magnification value by substituting the calculated value of flatness of the first semiconductor substrate W1 into a relational expression of flatness into which any of the coefficients k1 to k3 corresponding to the closest calculated value of flatness to the calculated value of flatness of the first semiconductor substrate W1 has been already input (Step S150). Alternatively, the correction-information calculator 26 calculates the corrected magnification value by substituting a coefficient corresponding to the closest calculated value of flatness to the calculated value of flatness of the first semiconductor substrate W1 (for example, any of k1 to k3) and the calculated value of flatness of the first semiconductor substrate W1 into the expression of flatness (the expression 1). Alternatively, the correction-information calculator 26 obtains the corrected magnification value from any of relational expressions between the input magnification values S1 to S3 and the calculated values of flatness C1 to C3, which corresponds to the closest calculated value of flatness to the calculated value of flatness of the first semiconductor substrate W1. The output portion 27 sends the corrected magnification value to the control device 30.

Further, the control device 30 controls the stress device 8 with the corrected magnification value that has been calculated to apply a stress to the first semiconductor substrate W1 (Step S160). Thereafter, the bonding apparatus 101 bonds the first and second semiconductor substrates W1 and W2 to each other while applying a stress based on the corrected magnification value (Step S170). Through these processes, a semiconductor device in which the semiconductor element formed on the first semiconductor substrate W1 and the semiconductor element formed on the second semiconductor substrate W2 are electrically connected, is manufactured.

As described above, the bonding apparatus 101 according to the present embodiment calculates in advance relational expressions of flatness that correspond to a variety of flatness (the amounts of warpage) by using the first and second substrates for learning W1s and W2s. In an actual bonding process, the bonding apparatus 101 calculates a corrected magnification value by using a relational expression of flatness corresponding to flatness of the first semiconductor substrate W1. The bonding apparatus 101 can reduce the amount of pattern misalignment between the first and second semiconductor substrates W1 and W2 (can make the amount of pattern misalignment close to zero) by bonding the first and second semiconductor substrates W1 and W2 to each other by using this corrected magnification value. That is, the bonding apparatus 101 according to the present embodiment can bond the second semiconductor substrate W2 while correcting the shape of the first semiconductor substrate W1 with a corrected magnification value that is appropriate for the shapes of the semiconductor substrates W1 and W2.

Further, according to the present embodiment, it is not necessary for an operator to input an input magnification value via the correction-information calculation device 20 in actual bonding. Alternatively, it is possible to correct the input magnification value input by the operator, with a corrected magnification value. Furthermore, it suffices that, in an actual bonding process, the bonding apparatus 101 selects a relational expression of flatness based on flatness of the first semiconductor substrate W1 and calculates the corrected magnification value by using the relational expression of flatness. Therefore, in actual bonding, the bonding apparatus 101 does not have to perform any complicated calculation. It suffices that the bonding apparatus 101 performs light-load calculation. In addition, it is possible to prevent errors of input of the input magnification value by the operator.

The amount of pattern misalignment includes various components. The components of the amount of pattern misalignment are described here. FIG. 9 is a diagram illustrating component examples of the amount of pattern misalignment.

FIG. 9 illustrates (a) an offset component, (b) a magnification component, (c) a diamond component, (d) an eccentric magnification component, (e) a trapezoidal component, (f) a fan-shaped component, (g) a C-shaped magnification component, (h) an accordion component, (i) a C-shaped distortion component, and (j) a streamflow component.

(a) The offset component is $\Delta dx = K1$ and $\Delta dy = K2$.

(b) The magnification component is $\Delta dx = K3 \cdot x$ and $\Delta dy = K4 \cdot y$.

(c) The diamond component is $\Delta dx = K5 \cdot y$ and $\Delta dy = K6 \cdot x$.

(d) The eccentric magnification component is $\Delta dx = K7 \cdot x^2$ and $\Delta dy = K8 \cdot y^2$.

(e) The trapezoidal component is $\Delta dx = K9 \cdot x \cdot y$ and $\Delta dy = K10 \cdot x \cdot y$.

(f) The fan-shaped component is $\Delta dx = K11 \cdot y^2$ and $\Delta dy = K12 \cdot x^2$.

(g) The C-shaped magnification component is $\Delta dx = K13 \cdot x^3$ and $\Delta dy = K14 \cdot y^3$.

(h) The accordion component is $\Delta dx = K15 \cdot x^2 \cdot y$ and $\Delta dy = K16 \cdot x \cdot y^2$.

(i) The C-shaped distortion component is $\Delta dx = K17 \cdot x \cdot y^2$ and $\Delta dy = K18 \cdot x^2 \cdot y$.

(j) The streamflow component is $\Delta dx = K19 \cdot y^3$ and $\Delta dy = K20 \cdot x^3$.

The amount of pattern misalignment between the first and second semiconductor substrates W1 and W2 is a combination of these components. Because such positional misalignment corresponds to substrate flatness, the spherical approximation portion 23 calculates the Zernike coefficients by performing approximation with the Zernike series for the substrate flatness. The Zernike terms in the Zernike polynomial are described here.

Figure 10A:
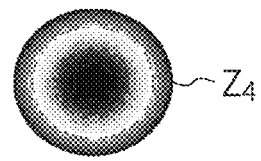
FIGS. 10A and 10B are explanatory diagrams of the Zernike terms.
Figure 10B:
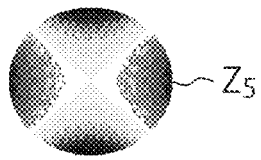

FIGS. 10A and 10B are explanatory diagrams of the Zernike terms. Among the Zernike terms Z1 to Z81 in the Zernike polynomial (a circle polynomial), the Zernike terms that affect substrate flatness are Z4 illustrated in FIG. 10A and Z5 illustrated in FIG. 10B, for example. However, the Zernike terms illustrated in FIGS. 10A and 10B are merely an example.

Figure 11:
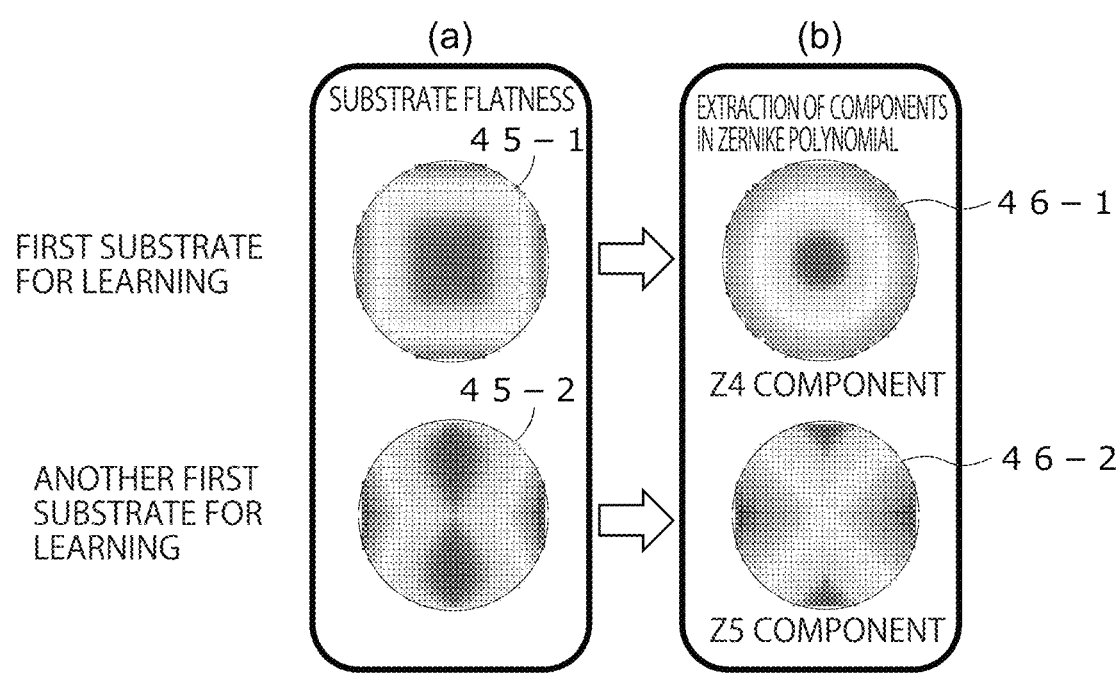
FIG. 11 is a diagram illustrating a part of a step of calculating a calculated value of flatness according to the present embodiment.

FIG. 11 is a diagram illustrating a part of a step of calculating a calculated value of flatness according to the present embodiment. (a) in FIG. 11 illustrates substrate flatness 45-1 and substrate flatness 45-2 of the first substrates for learning W1s. (b) in FIG. 11 illustrates extracted components 46-1 and 46-2 among components in the Zernike polynomial for a plurality of the first substrates for learning W1s.

The components 46-1 and 46-2 in the Zernike polynomial illustrated in (b) in FIG. 11 are calculated by using the substrate flatness 45-1 and the substrate flatness 45-2 illustrated in (a) in FIG. 11. The component 46-1 in the Zernike polynomial for a certain one of the first substrates for learning W1s has the Z4 component in the Zernike polynomial. The component 46-2 in the Zernike polynomial for another one of the first substrates for learning W1s has the Z5 component in the Zernike polynomial.

The bonding apparatus 101 according to the present embodiment creates a relational expression of flatness by using a calculated value of flatness calculated based on an extracted component in the Zernike polynomial in this manner.

Figure 12:
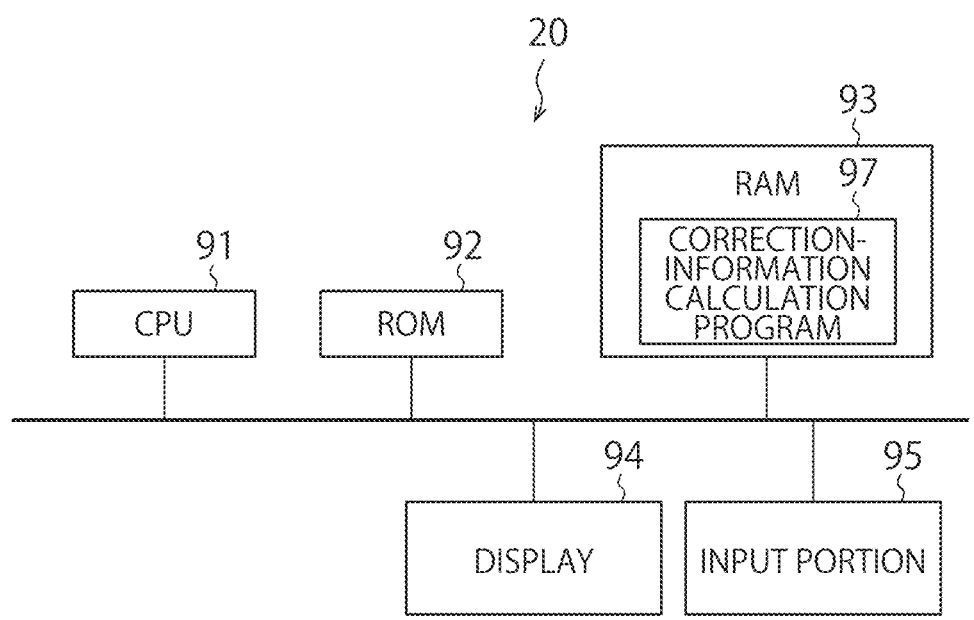
FIG. 12 illustrates a state where the correction-information calculation program has been loaded into the RAM.

FIG. 12 is a diagram illustrating a hardware configuration of a correction-information calculation device according to the present embodiment. The correction-information calculation device 20 includes a CPU (Central Processing Unit) 91, a ROM (Read Only Memory) 92, a RAM (Random Access Memory) 93, a display 94, and the input portion 95. In the correction-information calculation device 20, the CPU 91, the ROM 92, the RAM 93, the display 94, and the input portion 95 are connected to one another via a bus line.

The CPU 91 calculates a magnification response function by using a correction-information calculation program 97 that is a computer program. The correction-information calculation program 97 is a computer program product that has a non-transitory computer readable recording medium including a plurality of computer-executable instructions for calculating the magnification response function. In the correction-information calculation program 97, the instructions cause a computer to calculate a corrected magnification value.

The display 94 is a display device such as a liquid crystal monitor, and displays substrate flatness, the amount of positional misalignment, correspondence information, a relational expression of flatness, the corrected magnification value, and the like based on an instruction from the CPU 91.

The input portion 95 is configured to include a mouse and a keyboard, and inputs instruction information (e.g., parameters required for calculation of the magnification response function) input from outside by a user. The instruction information input to the input portion 95 is sent to the CPU 91.

The correction-information calculation program 97 is stored in the ROM 92 and is loaded into the RAM 93 via the bus line. FIG. 12 illustrates a state where the correction-information calculation program 97 has been loaded into the RAM 93.

The CPU 91 executes the correction-information calculation program 97 loaded into the RAM 93. Specifically, in the correction-information calculation device 20, the CPU 91 reads out the correction-information calculation program 97 from the ROM 92, loads the program into a program storage area in the RAM 93, and performs various processes in accordance with input of an instruction from the input portion 95 by the user. The CPU 91 temporarily stores various types of data generated in the various processes in a data storage area formed in the RAM 93.

The correction-information calculation program 97 to be executed in the correction-information calculation device 20 has a module configuration including the spherical approximation portion 23, the flatness calculator 24, the relational expression creator 25, and the correction-information calculator 26. These elements are loaded onto a main storage device and are generated thereon.

When the semiconductor substrates W1 and W2 are bonded to each other, the stress device 8 applies a stress to the semiconductor substrate W1 based on a corrected magnification value. Accordingly, the bonding apparatus 101 performs a bonding process in a state where the magnification of a bonding pattern on the semiconductor substrate W1 has been corrected.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A bonding apparatus comprising:
a first stage configured to hold a first substrate;
a second stage configured to hold a second substrate, the second stage being opposed to the first stage;
a stress application portion configured to apply a stress to the first substrate based on a magnification value while the first and second substrates are bonded to each other;
a calculator configured to calculate the magnification value based on a flatness of the first substrate and a first equation, the first equation representing a relation between a flatness of a first learning substrate, the magnification value, and an amount of pattern misalignment between the first learning substrate and a third substrate bonded to the first learning substrate; and
a controller configured to control the stress application portion;
wherein the calculator calculates, for each flatness C of a plurality of the first learning substrate, a coefficient k from an equation 1 by using the magnification value S and an amount of pattern misalignment OL between the first learning substrate and the third substrate, where the equation 1 is OL=S+k×C, and
further calculates the first equation by substituting the calculated coefficient k into the equation 1.

2. The device of claim 1, wherein
a plurality of the first equation is calculated for each flatness of a plurality of the first learning substrate, and the calculator selects one of the first equation in accordance with the flatness of the first substrate and calculates the magnification value.

3. The device of claim 1, wherein the first equation is a relational expression between the magnification value and the flatness that the amount of pattern misalignment to be zero.

4. The device of claim 2, wherein the first equation is a relational expression between the magnification value and the flatness that the amount of pattern misalignment to be zero.

5. The device of claim 1, further comprising:
- a flatness measurement portion configured to measure flatness of the first learning substrate or the first substrate on the first stage;
- a pattern-misalignment-amount measurement portion configured to measure the amounts of pattern misalignment by using a plurality of the first learning substrate and a plurality of the magnification values while each of the first learning substrate and the third substrate are bonded to each other; and
- a storage configured to store the first equation.

6. The device of claim 1, wherein the calculator performs spherical approximation for the flatness of the first learning substrate or the first substrate to calculate the first equation or the magnification value.

* * * * *